(12) United States Patent  
Chen

(10) Patent No.: US 7,759,023 B2  
(45) Date of Patent: Jul. 20, 2010

(54) HYBRID MASK AND METHOD OF MAKING SAME

(75) Inventor: Yung-Tin Chen, Santa Clara, CA (US)

(73) Assignee: Sandisk 3D LLC, Milpitas, CA (US)

( * ) Notice: Subject to any disclaimer, the term of this patent is extended or adjusted under 35 U.S.C. 154(b) by 440 days.

(21) Appl. No.: 11/648,245

(22) Filed: Dec. 29, 2006

(65) Prior Publication Data

US 2008/0160424 A1 Jul. 3, 2008

(51) Int. Cl.
*G03F 1/00* (2006.01)
(52) U.S. Cl. ............................................. 430/5; 216/12
(58) Field of Classification Search ...................... 430/5, 430/311–313, 322; 216/12
See application file for complete search history.

(56) References Cited

U.S. PATENT DOCUMENTS

| | | | |
|---|---|---|---|
| 5,281,500 A * | 1/1994 | Cathey et al. ................. | 430/5 |
| 5,300,377 A | 4/1994 | Keum | |
| 5,446,521 A | 8/1995 | Hainsey et al. | |
| 5,672,450 A * | 9/1997 | Rolfson ......................... | 430/5 |
| 6,399,286 B1 | 6/2002 | Liu et al. | |
| 2005/0064303 A1* | 3/2005 | Yamada et al. ................. | 430/5 |
| 2005/0082559 A1* | 4/2005 | Hasan Zaidi et al. .......... | 257/98 |
| 2005/0084769 A1* | 4/2005 | Pinkerton et al. .............. | 430/5 |
| 2005/0139575 A1* | 6/2005 | Lee .............................. | 216/12 |
| 2005/0148195 A1 | 7/2005 | Koehle et al. | |
| 2006/0134531 A1 | 6/2006 | Song et al. | |

FOREIGN PATENT DOCUMENTS

| | | |
|---|---|---|
| JP | 10-282636 | 10/1998 |
| WO | WO 01/22171 A1 | 3/2001 |

OTHER PUBLICATIONS

Cheng, Yung Feng, et al., "Study of Effects of Sidewall Angle on Process Window Using 193nm CPL Masks in a 300mm Wafer Manufacturing Environment", The International Society for Optical Engineering; 25th Annual Bacus Symposium on Photomask Technology, 2005, vol. 5992, No. 2.

* cited by examiner

*Primary Examiner*—Mark F Huff
*Assistant Examiner*—Stewart A Fraser
(74) *Attorney, Agent, or Firm*—Foley & Lardner LLP

(57) ABSTRACT

A hybrid topography mask is designed for facilitating the fabrication of a semiconductor wafer. The hybrid mask includes a substrate having a light receiving surface. The light receiving surface defines a plane. Pluralities of pattern elements are etched into and out of the light receiving surface. Each of the plurality of pattern elements defines a pattern surface that is parallel to the light receiving surface. Pattern sides extend between the pattern elements and the light receiving surface. Each of the pattern sides extends perpendicularly between the light receiving surface and the pattern elements. The hybrid mask also includes a tapered sub-resolution assist element etched out of the light receiving surface to position the mask with respect to the semiconductor wafer. The tapered sub-resolution assist element is fabricated to avoid affecting any photoresist residue from the sub-resolution assist element's presence on the semiconductor wafer disposed adjacent the hybrid mask.

2 Claims, 5 Drawing Sheets

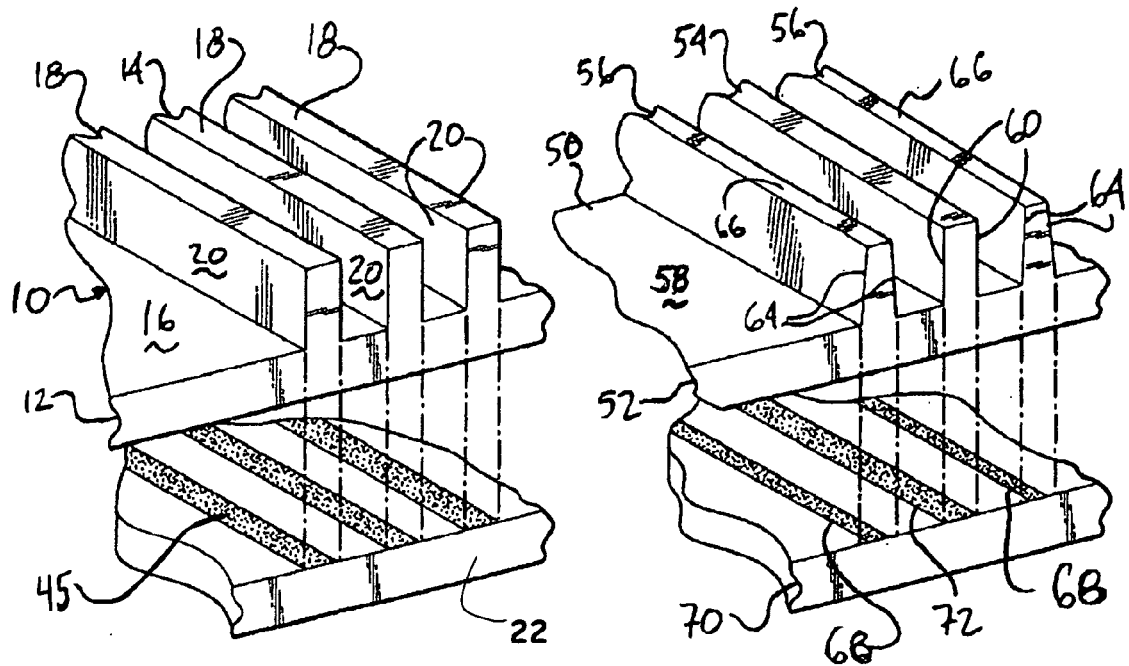
FIG - 5A  FIG - 5B
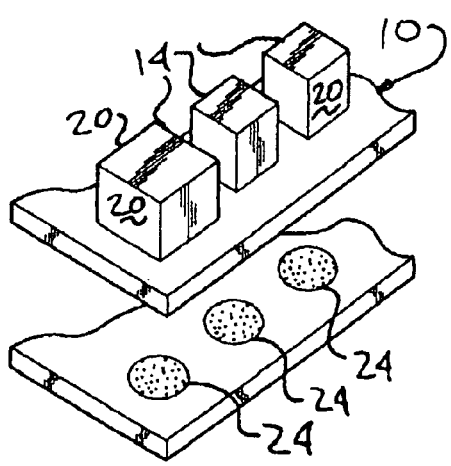 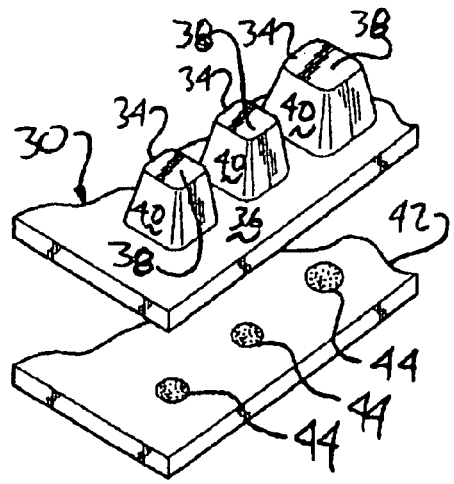
FIG - 6A  FIG - 6B

HYBRID MASK AND METHOD OF MAKING SAME

BACKGROUND ART

1. Field of the Invention

The invention relates generally to a mask used in the manufacture of semiconductor wafers. More particularly, the invention relates to a mask having a modified topography to facilitate optical proximity correction with minimal effect on the semiconductor wafer.

2. Description of the Related Art

Masks used in the fabrication of semiconductor wafers define topography. The topography changes, alters and/or blocks light passing therethrough in the creation of the semiconductor wafer. Optics are used to focus light as it is sent through the mask to make smaller images on the semiconductor wafer allowing the semiconductor wafer to be formed in the image of the mask. While the optics are very precise, the physics of producing a semiconductor wafer with such small dimensions results in discrepancies between the topographies of the mask and the semiconductor wafer to the extent that modifications to the mask topography will aid in creating the semiconductor wafer with the desired topography.

Optical proximity correction (OPC) is a proven technique that facilitates the fabrication of a semiconductor wafer with a topography that is desired. OPC designs are created through an iterative process that models the topography of a mask and predicts how much of the topography of the semiconductor wafer will mirror what is actually desired out of its topography. The mask topography changes from the "ideal" topography to compensate for the properties of the light, optics and materials being used.

Along with OPC, cornering is a method used to reduce the critical dimension (CD) of elements formed on a semiconductor wafer. By rounding the corners, the dose required to create a feature or element is reduced. In other words, the CD of a semiconductor wafer is reduced given a fixed dose. By incorporating the methods of OPC and rounding of corners, the CD of the semiconductor wafer can be reduced.

Yet another method of increasing the CD on a semiconductor wafer is to taper mask edges. U.S. Pat. No. 6,399,286 discloses a method for fabricating a semiconductor wafer wherein the CD of the semiconductor wafer is reduced by tapering edges of elements in the mask layer. This mask is not, however, designed to minimize the number of elements created on the semiconductor wafer as compared to the number of elements fabricated on the mask.

SUMMARY OF THE INVENTION

A mask is designed for facilitating the fabrication of a semiconductor wafer. The mask includes a substrate having a light-receiving surface. The light-receiving surface defines a plane. Pluralities of pattern elements are etched into and out of the light-receiving surface. Each of the plurality of pattern elements defines a pattern surface that is parallel to the light-receiving surface. Pluralities of pattern sides extend between the plurality of pattern elements and the light-receiving surface. Each of the plurality of pattern sides extends perpendicularly between the light receiving surface and the plurality of pattern elements. The mask also includes a tapered sub-resolution assist element etched out of the light-receiving surface to position the mask with respect to the semiconductor wafer. The tapered sub-resolution assist element is fabricated to avoid affecting any photoresist deposited on the semiconductor wafer disposed adjacent the mask.

BRIEF DESCRIPTION OF THE DRAWINGS

Advantages of the invention will be readily appreciated as the same becomes better understood by reference to the following detailed description when considered in connection with the accompanying drawings, wherein:

FIGS. 5A and 5B are exploded perspective views of mask topographies employing a standard fabrication method and the inventive method, respectively;

FIGS. 6A and 6B are exploded perspective views of mask topographies employing a standard fabrication method and the inventive method, respectively;

DETAILED DESCRIPTION OF THE PREFERRED EMBODIMENTS

Figure 1:
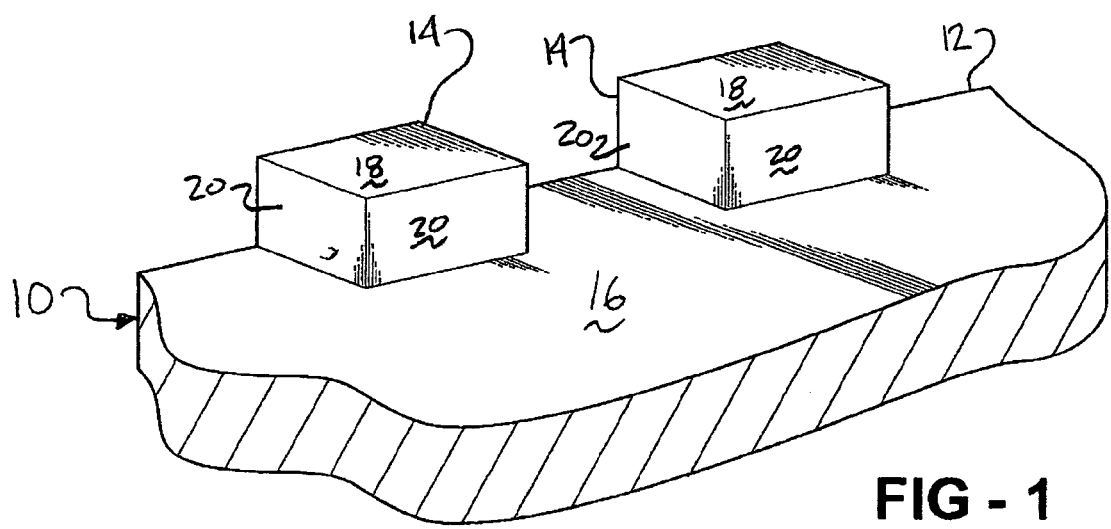
FIG. 1 is a fragmentary perspective view of a standard mask topography.

Referring to FIG. 1, a mask of the prior art is generally indicated at 10. The mask 10 has a substrate 12 and a plurality of pattern or feature elements 14. For purposes of simplifying the drawings and the description, there are only two pattern elements 14 shown. The substrate defines a light receiving surface 16, which defines the primary plane of the substrate 12 through which much of the light that is used to pattern a semiconductor wafer is transmitted.

Each of the pattern elements 14 has a pattern surface 18 and at least one pattern side 20. In the embodiment shown, there are approximately four pattern sides 20 for each pattern element 14. It should be appreciated by those skilled in the art that any number of pattern sides 20, including a single pattern side 20, may be used in the formation of a pattern element 14. The pattern surface 18 is parallel to the light receiving surface 16 and the pattern sides 20 are perpendicular to both the light receiving surface 16 and the pattern sides 20.

Figure 2:
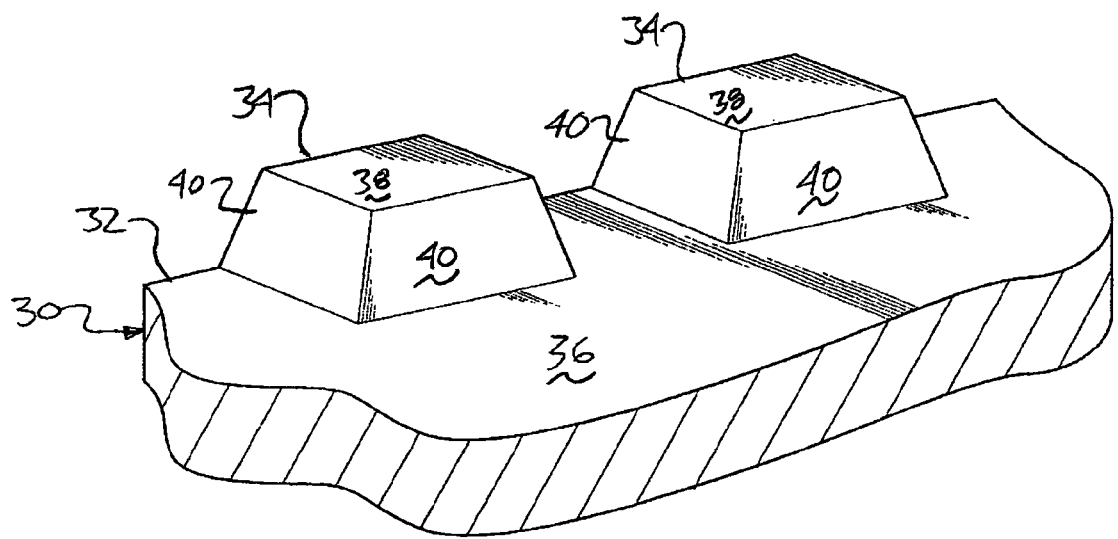
FIG. 2 is a fragmentary perspective view of a mask topography according to the invention.

Referring to FIG. 2, an example of a mask fabricated according to the inventive embodiment, discussed subsequently, is generally shown at 30. As with the mask 10 of the prior art shown in FIG. 1, the mask 30 has a substrate 32 and a plurality of pattern elements 34 which are shown extending out of the substrate 32. The substrate 32 defines a light receiving surface 36. Each of the plurality of pattern elements 34 includes a pattern surface 38 which is substantially parallel to the light receiving surface 36. The difference between this mask 30 and the mask 10 of the prior art is that the mask 30 according to the invention includes pattern sides 40 that not perpendicular to either the light receiving surface 36 or the pattern surface 38.

Figure 3A:
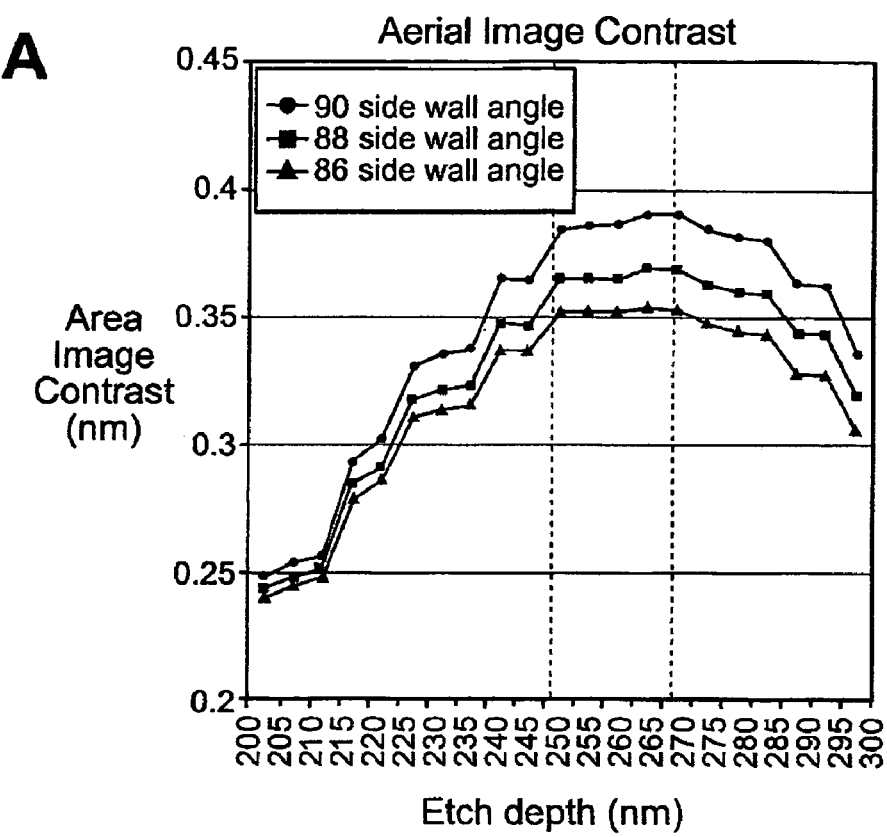
FIGS. 3A and 3B are graphic representations showing image contrast and image CD as a function of side wall angle.
Figure 3B:
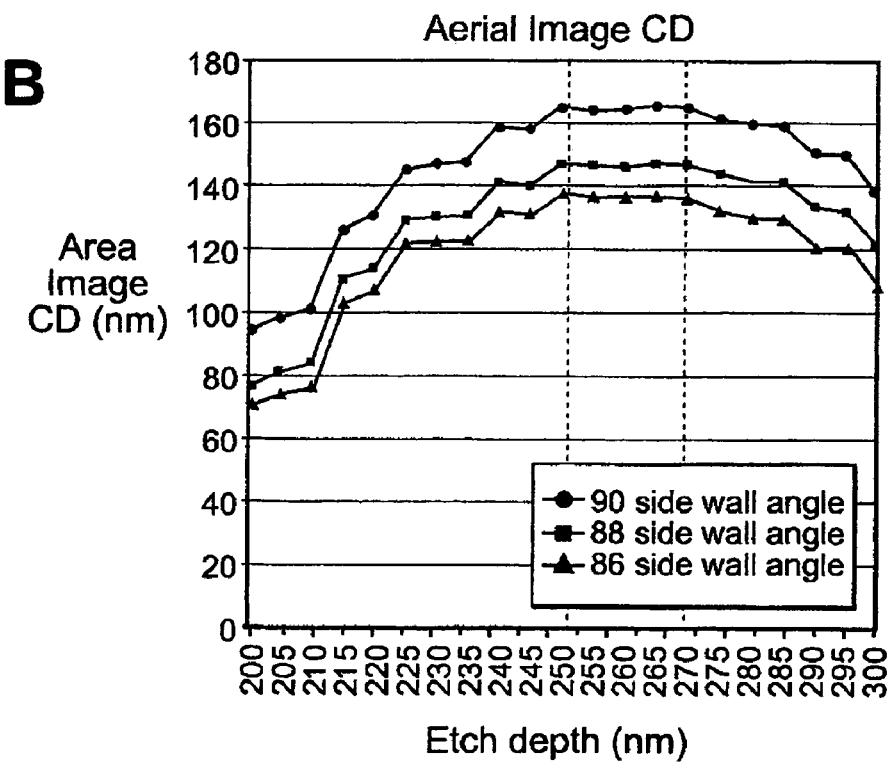

The angle of the pattern sides 40 affects the CD of the mask 30. By reducing the angle between the light receiving surface 36 and the appropriate pattern side 40, the CD on the wafer is reduced with the same dose. FIGS. 3A and 3B illustrate the effect of the configuration of the pattern walls 40 on light intensity contrast as well as the aerial image CD using a mask topography simulation. As the angle set forth above is minimized, so too is the wafer CD. This principle can be utilized to compensate the resolution limit of an E-beam writer that is used to create the mask 30 to allow pedestal-type pattern elements 34 and sub-resolution assist elements (discussed subsequently) to be made with achievable dimensions while reducing the effect they have on the semiconductor wafer being manufactured therewith.

Figure 4A:
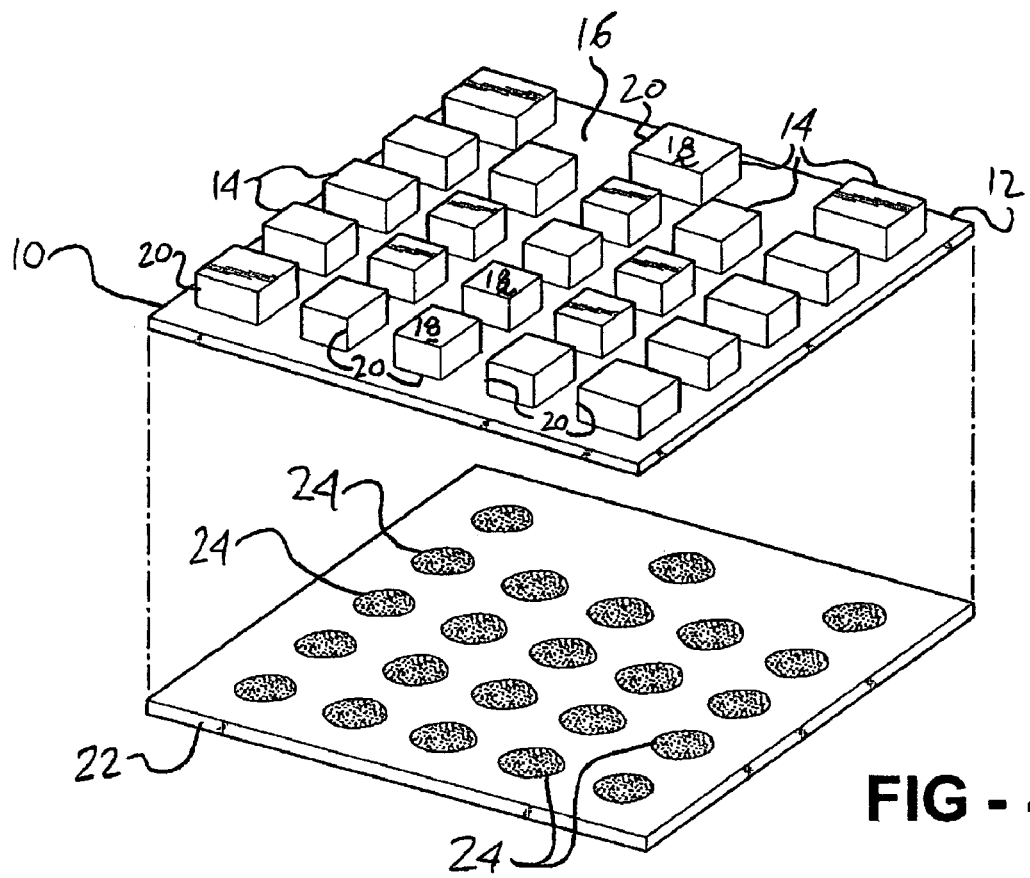
FIGS. 4A and 4B are exploded perspective views of mask topographies employing a standard fabrication method and the inventive method, respectively.
Figure 4B:
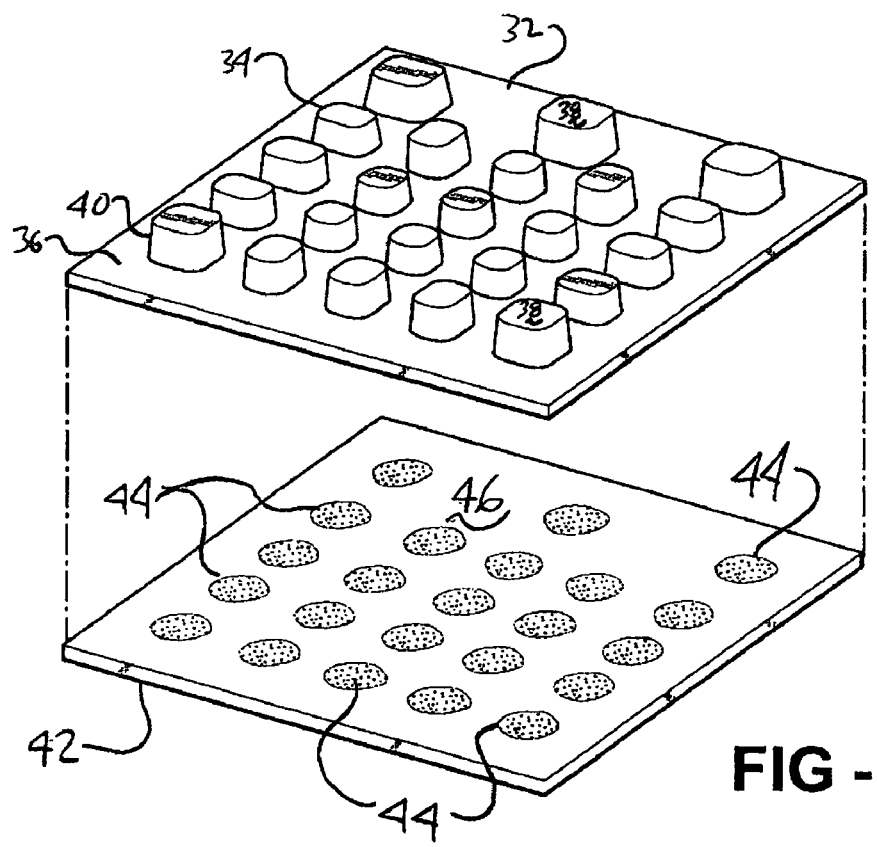

FIGS. 4A and 4B are shown side-by-side to illustrate the differences in dose required to produce similar elements on a semiconductor wafer 22, 42, respectively. In FIG. 4A, the prior art mask 10 is manufactured using traditional methods wherein the pattern sides 20 are perpendicular to both the light receiving surface 16 and the pattern surfaces 18. The semiconductor wafer 22 illustrated there below has pedestal patterns 24 that are stippled to show that a higher dose is required for those pedestal patterns 24 with respect to the same pedestal patterns 44 that are created by the mask 30 that non-perpendicular pattern sides 40. By using non-perpendicular pattern sides, the CD for the semiconductor wafer 42 can be reduced sufficiently to provide freedoms in the design parameters of the mask 30. Certain elements may be fabricated into the mask 30 which will enhance the printability of mask 30 and not be transferred to a surface 46 of the semiconductor wafer 42.

The converse of changes in dose levels is represented in FIGS. 6A and 6B. Using the same dose levels for both the mask 10 of the prior art and the inventive mask 30, it can be seen that the CD is reduced when using the pattern elements 34 with non-perpendicular pattern sides 40. With the perpendicular pattern sides 20 shown in FIG. 6A, the pedestal patterns 24 are large. Given the same dose with the mask 30 incorporating the non-perpendicular or tapered pattern sides 40, the CD of the semiconductor wafer 42 is smaller allowing for more freedom in the design of the semiconductor wafer 42.

Moving away from the pedestal-type features discussed thus far, FIGS. 5A and 5B illustrate how pattern elements that are elongated, e.g., lines, are improved by incorporating the inventive method and structure therein. FIG. 5A represents the prior art mask 10 and semiconductor wafer 22 wherein the pattern elements 14 create line patterns 45 that are equal in width. The relationship is generally linear between the reduced size of the pattern elements 14 and the line patterns in the semiconductor wafer 22.

FIG. 5B illustrates a mask 50 of hybrid configuration. In this embodiment, the mask 50 defines a substrate 52 having two types of pattern elements 54, 56 extending out of a light receiving surface 58. The first pattern element 54 is a primary element in the hybrid mask 50 and is shown in the center thereof. The primary element 54 is surrounded by secondary elements 56 as an example of one configuration. It should be appreciated by those skilled in the art that any configuration or combination of primary 54 and secondary 56 elements may be incorporated into the design of the hybrid mask 50. The primary element 54 is of a traditional configuration. More specifically, the primary element 54 includes primary pattern sides 60 that are perpendicular to a primary pattern surface 62 and the light receiving surface 58. The secondary pattern elements 56 have the tapered sides 64 that extend non-perpendicularly between a secondary pattern surface 66 and the light receiving surface 58. By using the tapered or non-perpendicular sides 64, the resulting secondary pattern 68 on the semiconductor wafer 70 is narrower than the resulting primary pattern 72. This facilitates an increased freedom of design by manufacturing the semiconductor wafer 70 with line patterns 68 having reduced widths.

In the process of manufacturing semiconductor wafers, the mask and the semiconductor wafer need to be in proper alignment. If not, the semiconductor wafer will fail. In many instances, pattern elements in the mask are dedicated the function of aligning the mask with respect to the semiconductor wafer. This is beneficial because the pattern element may be designed to optimize the alignment properties of the mask. The disadvantage of such an element is that it generally creates an unwanted pattern in the semiconductor wafer. The space consumed by the patterns, and the eventual markings, on the semiconductor wafer is space that cannot be used for functional elements. Therefore, it is desirable to have pattern elements on the mask that assist in the alignment of the mask with respect to the semiconductor wafer, but to have those pattern elements have no affect on the semiconductor wafer. In addition, these sub-resolution assist pattern elements may enhance the printability of main pattern elements.

Figure 7A:
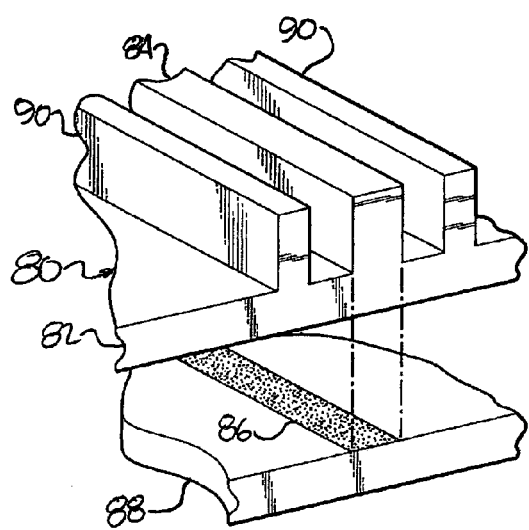
FIG. 7A is an exploded perspective view of a mask topography having an ideal configuration.

Referring to FIG. 7A, one such configuration is shown. In this embodiment, a mask 80 is shown having a substrate 82 and a pattern element 84 that is designed to create a pattern 86 on a semiconductor wafer 88. On either side of the pattern element is a sub-resolution assist element 90. Again, those skilled in the art shall appreciate that any configuration of the pattern element(s) 84 and the sub-resolution assist element(s) 90 may be incorporated into the design of the mask 80 based on the design parameters needed for the manufacture of the semiconductor wafer 88.

In the representation of the mask 80 in FIG. 7A, the pattern element 84 is shown to be approximately 45 nm wide. The sub-resolution assist elements 90 are, therefore, approximately 15 nm wide. When the sub-resolution assist elements 90 are only 15 nm wide, no residue or pattern is left or created on the semiconductor wafer 88. But, with the current E-beam technology, the creation of a sub-resolution assist element 90 with such a narrow width is not feasible or controllable and, therefore, the option depicted in FIG. 7A is not yet available.

Figure 7B:
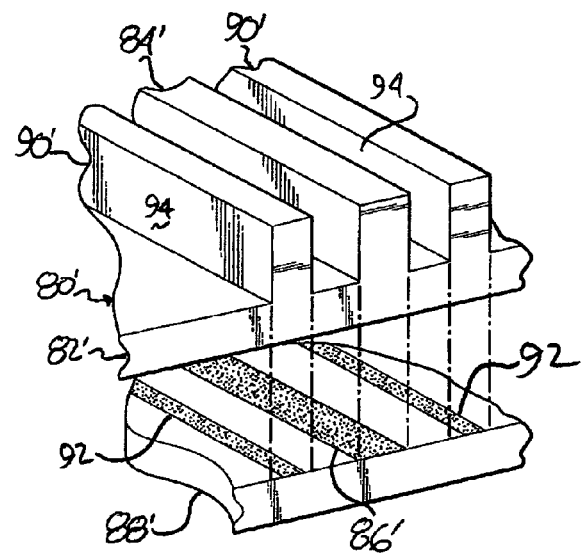
FIG. 7B is an exploded perspective view of a mask topography having a standard configuration.

To make a mask according to the current E-beam writing technology, the width of the smallest pattern element is approximately 35 nm. FIG. 7B illustrates sub-resolution assist elements 90' that approximate this obtainable width, wherein like primed reference characters represent elements similar to the elements in FIG. 7A. These sub-resolution assist elements 90' are not, however, sub-resolution as they leave a residue 92 on the semiconductor wafer alongside the desired pattern 86'. Therefore, making sub-resolution assist elements 90' with a normal profile, i.e., with perpendicular pattern sides 94, will result in an undesirable result of having a pattern of residue 92 on the semiconductor wafer 88' where it is not desired.

Figure 7C:
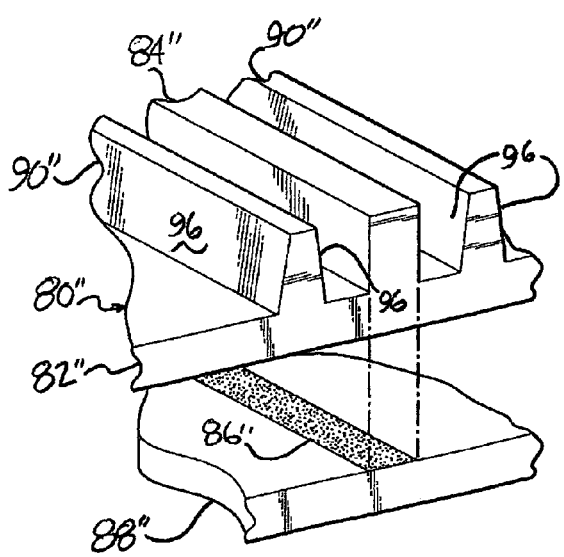
FIG. 7C is an exploded perspective view of a mask topography having a configuration according to the invention.

Using the technology of the tapered sides as discussed above, the sub-resolution assist elements 90" can be created, wherein like double primed reference characters in FIG. 7C represent elements similar to those in FIG. 7A. In this instance, the sub-resolution assist elements 90" can be created using the current E-beam writing technology, but with the tapered or non-perpendicular sides 96, the sub-resolution assist elements 90" having a 35 nm width leave no pattern or residue on the semiconductor wafer 88". This allows the semiconductor wafer 88" to be produced without artifacts create due to devices created in the mask 80" to help with the alignment of the mask 80" with respect to the semiconductor wafer 88".

Figure 8:
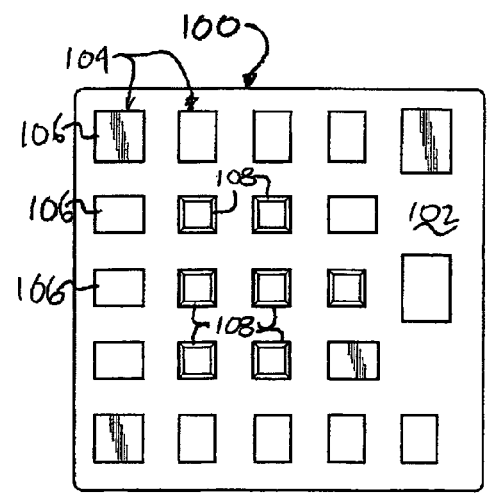
FIG. 8 is a top view of a hybrid topography incorporating pedestal-style elements having standard and inventive profiles.

FIG. 8 is a top view of a mask 100 having a substrate 102 with pattern elements, generally indicated at 104 extending out therefrom. The pattern elements 104 are fabricated in a multi-step process. In the first portion of the process, the first set 106 of the pattern elements 104 are created. The first set 106 includes edge OPC pedestal-type elements that have sides that are perpendicular to the substrate 102. The second sets of center pedestal-type elements 108 have tapered sides so that the wafer CD is reduced on those elements 108. It is generally desirable that the edge pedestal CD is sufficiently larger than the center pedestal CD on the wafer. The implementation of hybrid pedestal profile allows an appropriate OPC sizing to be carried out between the edge pedestals and center pedestals. Otherwise, the mask CD of edge pedestals will become too large that the corner to corner spacing between two diagonally adjacent edge pedestals will become too small for mask making.

The method for producing the mask 80", 100 of hybrid configuration begins with the provision of a substrate. It is contemplated that the substrate is quartz or some similar material that is substantially transparent. A layer of photoresist is applied to the substrate. A first set of elements or features is then created out of the substrate once a pattern in the photoresist is formed.

Once the first set of elements is created, i.e., the feature elements, another layer of photoresist is applied to the substrate. A second pattern is created. From this pattern, the sub-resolution assist elements are formed. Removal of the second layer of photoresist is then performed. The final formation of the hybrid mask 80", 100 includes elements of tradition profile (those having perpendicular sides) and those elements having tapered sides that allow for more efficient spacing or the complete transparency thereof with respect to the effect those tapered profile elements have in the subsequent manufacture of the semiconductor wafer. The degree of tapered edges can be controlled during quartz etch step, which is well known in the mask making technology.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

I claim:

1. A method of forming a photolithography mask, comprising:
    providing a transparent mask substrate;
    forming a first photoresist layer over the substrate;
    patterning the first photoresist layer;
    patterning the substrate so as to form first features in the substrate by using the first photoresist layer as a mask;
    forming a second photoresist layer over the patterned substrate;
    patterning the second photoresist layer; and
    patterning the substrate so as to form second features by using the second photoresist layer as a mask;
    wherein the first features comprise at least one primary pattern element comprising at least one sidewall extending from a light receiving surface portion of the substrate perpendicularly to a surface portion of the primary pattern element, and the second features comprise at least one secondary pattern element comprising at least one sidewall extending from the light receiving surface portion of the substrate non-perpendicularly to a surface portion of the secondary pattern element.

2. The method of claim 1, wherein the at least one primary pattern element comprises a plurality of OPC edge pedestal-type elements formed at the edge portions of the mask, and the at least one secondary pattern element comprises a plurality of center pedestal-type elements and are formed at the center portions of the mask; and
    wherein critical dimensions of the OPC edge pedestal-type elements are substantially larger than critical dimensions of the center pedestal-type elements.

* * * * *